United States Patent
Thapar

(10) Patent No.: US 6,437,390 B1
(45) Date of Patent: Aug. 20, 2002

(54) REVERSED SOURCE-DRAIN MOSGATED DEVICE

(75) Inventor: Naresh Thapar, Los Angeles, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/907,262

(22) Filed: Jul. 17, 2001

Related U.S. Application Data

(60) Provisional application No. 60/235,533, filed on Sep. 26, 2000.

(51) Int. Cl.$^7$ ................................................ H01L 29/72
(52) U.S. Cl. .................... 257/302; 257/329; 257/330; 257/336
(58) Field of Search ................. 257/302, 329, 257/330, 336

(56) References Cited

U.S. PATENT DOCUMENTS 6,124,611 A * 9/2000 Mori ......................... 257/330

* cited by examiner

Primary Examiner—Edward Wojciechowicz
(74) Attorney, Agent, or Firm—Ostrolenk, Faber, Gerb & Soffen, LLP

(57) ABSTRACT

A MOSgated device with a minimum overlap between the gate and drain electrodes is comprised of an N$^+$ substrate which receives an epitaxial layer of silicon. The body of the epitaxial layer has an N$^-$ lower layer for an accumulation device or a P$^-$ drift lower layer. In each case the top of the epitaxial layer is N$^+$. Both can be operated in an a–c mode. A trench gate consists of a trench through the epitaxial layer which has a thin gate oxide layer on its walls and bottom and a conductive polysilicon gate body filling the trench. The thin oxide on the bottom of the trench may be thicker than the oxide on the walls to reduce gate capacitance. A thick isolation oxide which is about 10 times as thick as the gate oxide overlies the top of the polysilicon. A planar drain electrode overlies the N$^+$ top layer and the laterally spaced isolation oxide; and a planar source electrode contacts the bottom of the substrate.

26 Claims, 2 Drawing Sheets

US 6,437,390 B1

REVERSED SOURCE-DRAIN MOSGATED DEVICE

RELATED APPLICATIONS

This application claims the benefit of U.S. Provisional Application No. 60/235,533, filed Sep. 26, 2000.

BACKGROUND OF THE INVENTION

This invention relates to MOSgated devices and more specifically relates to a novel structure for a MOSgated device with a reduced gate-to-drain capacitance.

The periodic charging/discharging of the parasitic gate-drain (Miller) capacitance of a MOSFET during each switching cycle is known to increase the power dissipated within the conventional trench-gate MOSFET structures. This decreases the efficiency of the power system and limits the operating frequency of the MOSFETs. Furthermore, the gate-drain capacitance makes the MOSFET susceptible to spurious turn-on, induced by a rapidly changing drain voltage (dv/dt induced turn-on). Sometimes, this leads to the destructive failure of the MOSFET. The novel reverse source-drain FET structures of this invention significantly reduces the gate-drain capacitance and susceptibility to spurious turn-on.

BRIEF SUMMARY OF THE INVENTION

A significant portion of the gate-drain capacitance (Cgd) of a conventional MOSFET is the oxide capacitance (Cox) in the gate-drain overlap area. The oxide capacitance (Cox) is inversely proportional to the oxide thickness (tox) in the gate-drain overlap region and directly proportional to the gate-drain overlap area. In accordance with the invention, the arrangement of the source and drain electrodes (with respect to the gate electrode) is reversed. The reversed source-drain FET structure significantly lowers the gate-drain capacitance by reducing the overlap area of gate and drain and by increasing the oxide thickness between the gate and the drain electrodes.

DETAILED DESCRIPTION OF THE DRAWINGS

Figure 1:
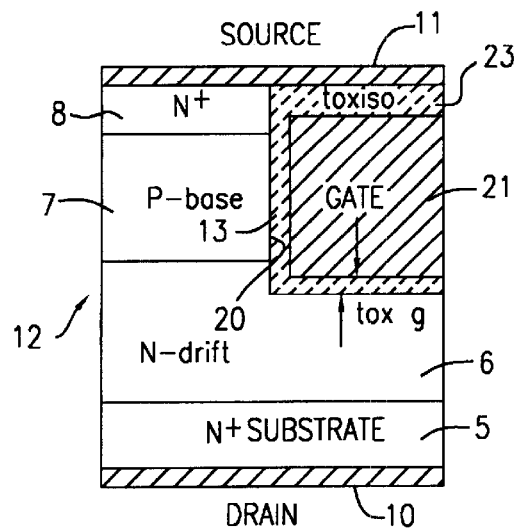
FIG. 1 is a cross-sectional diagram of one-half of a cell of a conventional trench gate MOSFET.
Figure 2:
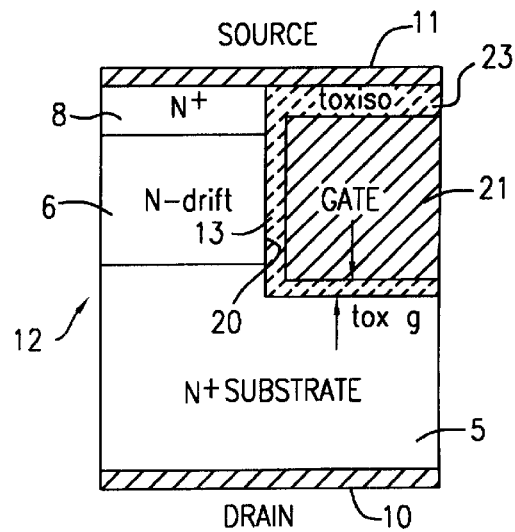
FIG. 2 is a cross-section like that of FIG. 1, but for a prior art depletion mode MOSFET with an accumulation channel (hereinafter an ACCUFET).
Figure 3:
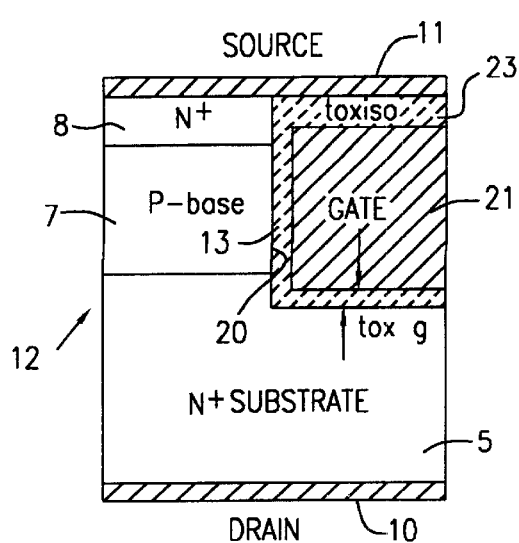
FIG. 3 is a cross-section like that of FIGS. 1 and 2, for a a conventional MOSFET adapted for a-c operation, hereinafter an INVFET.

The unit half-cell cross-sections of the conventional MOSFET, ACCUFET and the INVFET structures are shown in FIGS. 1, 2 and 3 respectively. In all of the conventional FET structures of FIGS. 1, 2 and 3, a non epi monocrystelline substrate 5 of any desired thickness has an epitaxially grown layer 12 grown thereon which consists of an N⁻ drift region 6 (FIGS. 1 and 2) a P⁻ base region 7 (FIGS. 1 and 3) and N⁺ source region 8. A drain electrode 10 is formed at the bottom surface of region 5 and is thus connected to the silicon epitaxially grown body 12 while the source electrode 11 is formed at the top surface of body 12. A trench 20 is formed in the silicon 12 and is lined with gate oxide 13. A conductive polyslicon gate 21 fills the trench 20 and defines an invertible channel region along its vertical height and between source region 8 and along the P⁻ base 7 or N⁻ drift region 6. The thickness of the gate oxide 13 in the gate-drain overlap area (at the bottom of trench 20) is tox,g which is generally less than about 500 Å. Since, tox,g is an order of magnitude smaller than the top isolation oxide layer 23 (conventionally about 4000 Å), the capacitance portion of $C_{gd}$ of the conventional MOSFET structures of FIGS. 1, 2 and 3 is an order of magnitude larger than that of the reverse source-drain MOSFETs of FIGS. 4 and 5 of the invention as will be seen. Consequently, the switching losses of the conventional FETs of FIGS. 1, 2 and 3 are higher than the MOSFET structures of FIGS. 4 and 5. Furthermore, due to a higher gate-drain capacitance, the convention FETs of FIGS. 1, 2 and 3 are more susceptible to the dv/dt induced turn-on.

Figure 4:
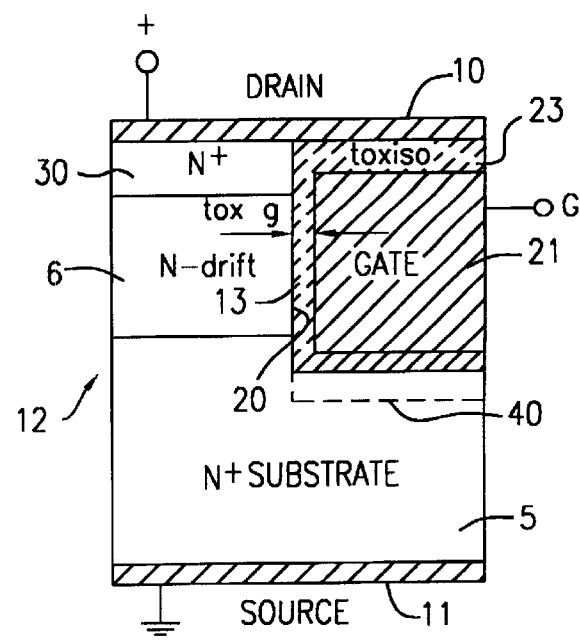
FIG. 4 is a cross-section like that of FIGS. 1, 2 and 3, for a reversed source-drain ACCUFET of the invention.
Figure 5:
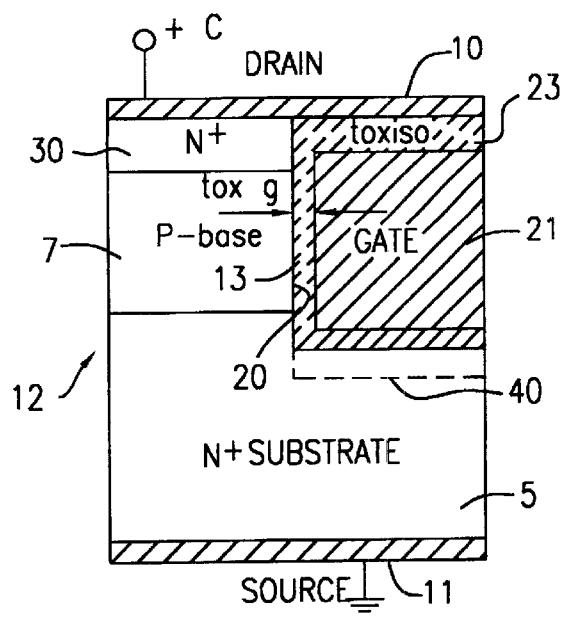
FIG. 5 is a cross-section like that of FIGS. 1 to 4 for a reversed source-drain INVFET of the invention.

Unit half-cell cross-sections of the proposed reverse source-drain ACCUFET and INVFET of the invention are shown in FIGS. 4 and 5, respectively. In these trench-gate MOSFET structures, similar numerals designate similar components. The drain electrode 10, however, is formed at the top surface of body 12 while the source electrode 11 is formed on its bottom surface. The thick (>4000 Å) oxide 23 over the gate polysilicon 21 within the trenches 20 now isolates the gate electrode 21 from the planar drain electrode 10. Thus, as seen in FIGS. 4 and 5, the drain electrode 10 overlaps the gate electrode 21 in areas with varying oxide thickness. The very short vertical overlap between the N+ drain diffusion 30 and the gate electrode 21 determines the overlap area with an underlying oxide thickness of tox,g while the horizontal overlap of the drain and gate electrodes 10 and 21 respectively in the trench region determines the overlap area with an underlying oxide thickness of tox,iso. In the rest of the overlap area, the underlying oxide thickness is in between tox,g and tox,iso.

The design considerations, the operational physics and the static performance of the proposed reversed source-drain MOSFET structures are identical to those of the conventional ACCUFET and INVFET structures. However, the switching performance (turn-on and turn-off times) of the proposed FET structures of FIGS. 4 and 5 are significantly superior to the conventional ACCUFET and INVFET structures. This is because the drain voltage fall time (during turn-on) and voltage rise time (during turn-off) are directly proportional to the gate-drain capacitance (Cgd). Consequently, the voltage rise time and fall times of the reverse source-drain FET structures are smaller than those of the conventional ACCUFET and INVFET structure.

The device of FIG. 4 is a depletion mode device and, in normal operation, the source 11 is at ground potential and the drain 10 is at a positive potential. The device turns off when gate 21 is shorted to the source 11. Thus, the work function difference between the $P^{31}$ type gate 21 and N⁻ drift region 6, gate 21 then cause the N⁻ drift region 6 to deplete and provide blocking voltage.

The device of FIG. 5 is an N channel device but will act as an a-c device in view of its NPN junction pattern.

It should be noted that both of the structures of FIGS. 4 and 5 will act as an a-c device in view of the symmetric structure N⁺/N⁻/N⁺ in FIG. 4 and N⁺/P⁻/N⁺ in FIG. 5.

Further, both structures of FIGS. 4 and 5 could have a trench bottom oxide thicker than the gate oxide for further reduction of the Qg (gate charge) thru a reduction in G-S capacitance. This is shown by the dotted line boundary 40 in FIGS. 4 and 5 for a thicker tox,g.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated device having a reversed source and drain configuration; said MOSgated device comprising a chip of silicon having a support substrate of one of the conductivity types and of a relatively high impurity concentration, an epitaxially deposited layer atop said support substrate and comprising a first relatively low impurity concentration layer of one of the conductivity types atop said support substrate and a second layer of said one of the conductivity types atop said first layer and having an upper surface; a trench extending into said upper surface of said second layer and extending through said first and second layers to a trench bottom surface; a thin gate oxide lining the bottom and side walls of said trench and a conductive gate body filling said trench; an isolation oxide extending over the top of said gate body; said isolation oxide being substantially thicker than said gate oxide; a planar drain electrode in contact with and extending across the top surface of said second layer and in contact with the top of said isolation oxide; and a planar source electrode extending across and in contact with the bottom of said support substrate.

2. The device of claim 1, wherein said one of the conductivity types is N.

3. The device of claim 1, wherein the conductivity type of said first layer is the same as that of said second layer.

4. The device of claim 1, where in said first layer is of a conductivity type opposite to that of said substrate.

5. The device of claim 3, wherein said one of the conductivity types is N.

6. The device of claim 4, wherein said one of the conductivity types is N.

7. The device of claim 1, wherein said gate oxide along the walls of said trench is about 500 Å thick.

8. The device of claim 3, wherein said gate oxide along the walls of said trench is about 500 Å thick.

9. The device of claim 4, wherein said gate oxide along the walls of said trench is about 500 Å thick.

10. The device of claim 5, wherein said gate oxide along the walls of said trench is about 500 Å thick.

11. The device of claim 6, wherein said gate oxide along the walls of said trench is about 500 Å thick.

12. The device of claim 1, wherein said source electrode is connected to ground and wherein said drain is connected to a positive potential relative to ground, and wherein said gate is connected to a positive potential relative to the potential of said drain.

13. The device of claim 4, wherein said source electrode is connected to ground and wherein said drain is connected to a positive potential relative to ground, and wherein said gate is connected to a positive potential relative to the potential of said drain.

14. The device of claim 6, wherein said source electrode is connected to ground and wherein said drain is connected to a positive potential relative to ground, and wherein said gate is connected to a positive potential relative to the potential of said drain.

15. The device of claim 1, wherein said drain electrode and said gate electrode have a minimized overlap.

16. The device of claim 1, wherein said gate body is polysilicon.

17. The device of claim 7, wherein said gate body is polysilicon.

18. The device of claim 12, wherein said gate body is polysilicon.

19. The device of claim 15, wherein said gate body is polysilicon.

20. An a–c MOSgated device comprising a chip of silicon having a support substrate of one of the conductivity types and of a relatively high impurity concentration, an epitaxially deposited layer atop said support substrate and comprising a first relatively low impurity concentration layer of one of the conductivity types atop said support substrate and a second layer of said one of the conductivity types atop said first layer and having an upper surface; a trench extending into said upper surface of said second layer and extending through said first and second layers to a trench bottom surface; a thin gate oxide lining the bottom and side walls of said trench and a conductive gate body filling said trench; an isolation oxide extending over the top of said gate body; said isolation oxide being substantially thicker than said gate oxide; a planar drain electrode in contact with and extending across the top surface of said second layer and in contact with the top of said isolation oxide; and a planar source electrode extending across and in contact with the bottom of said support substrate.

21. The device of claim 20, wherein said one of the conductivity types is N.

22. The device of claim 20, wherein the conductivity type of said first layer is the same as that of said second layer.

23. The device of claim 20, where in said first layer is of a conductivity type opposite to that of said substrate.

24. The device of claim 20, wherein said gate oxide along the walls of said trench is about 500 Å thick.

25. The device of claim 7, wherein said thin oxide lining the bottom of said trench is substantially thicker than said thin oxide lining the side walls of said trench, thereby to reduce the gate to source capacitance of said device.

26. The device of claim 24, wherein said thin oxide lining the bottom of said trench is substantially thicker than said thin oxide lining the side walls of said trench, thereby to reduce the gate to source capacitance of said device.

* * * * *